United States Patent
Morimoto et al.

(10) Patent No.: US 6,569,236 B1
(45) Date of Patent: May 27, 2003

(54) DEVICE AND METHOD FOR PRODUCING SINGLE-CRYSTAL INGOT

(75) Inventors: Shigeo Morimoto, Yokohama (JP); Hiroshi Monden, Hiratsuka (JP); Daisuke Ebi, Omura (JP); Toshirou Kotooka, Omura (JP)

(73) Assignee: Komatsu Denshi Kinzoku Kabushiki Kaisha, Hiratsuka (JP)

( * ) Notice: Subject to any disclaimer, the term of this patent is extended or adjusted under 35 U.S.C. 154(b) by 0 days.

(21) Appl. No.: 09/937,625
(22) PCT Filed: Mar. 29, 2000
(86) PCT No.: PCT/JP00/01940
§ 371 (c)(1),
(2), (4) Date: Sep. 27, 2001
(87) PCT Pub. No.: WO00/60144
PCT Pub. Date: Oct. 12, 2000

(30) Foreign Application Priority Data

Apr. 1, 1999 (JP) .................................... 11-094697
Jan. 25, 2000 (JP) ...................................... 2000-016343

(51) Int. Cl.$^7$ ............................................. C30B 15/20
(52) U.S. Cl. ........................ 117/15; 117/14; 117/30; 117/32; 117/202; 117/208
(58) Field of Search ............................ 117/14, 16, 30, 117/32, 202, 208

(56) References Cited

U.S. PATENT DOCUMENTS 5,567,399 A 10/1996 Ammon et al.
6,117,402 A * 9/2000 Kotooka et al. ......... 422/245.1

FOREIGN PATENT DOCUMENTS

EP 0591525 4/1994
JP 58217493 12/1983

* cited by examiner

Primary Examiner—Felisa Hiteshew
(74) Attorney, Agent, or Firm—Varndell & Varndell, PLLC

(57) ABSTRACT

A device for producing single-crystal ingot, provided with coolers (19) using a piping system through which cooling water failure caused by water leakage and at the same time to find out conditions for maximizing a production efficiency, the coolers (19) are disposed at portions of the inner sides of thermal shielding elements (18) and the lower ends (19a) of cooling pipes are so set as to be positioned up to 150 mm high from the surface (12a) of molten silicon liquid.

22 Claims, 1 Drawing Sheet

DEVICE AND METHOD FOR PRODUCING SINGLE-CRYSTAL INGOT

CROSS-REFERENCE TO RELATED APPLICATIONS

This application is a U.S. national phase application of International Application No. PCT/JP00/01940 filed Mar. 29, 2000, which application was not published in English.

TECHNICAL FIELD

This invention relates to a device and method for producing single-crystal ingot (particularly silicon single-crystal ingots) by the Czochralski method (CZ method).

BACKGROUND ART

The method for pulling single-crystals by the CZ method is commonly known art, and CZ method devices for producing single-crystal ingot are in wide use. In obtaining a single-crystal by the CZ method, the single-crystal is pulled up from the liquid surface of the raw material. The pulling speed and other conditions are variously set so as to reduce crystal defects and the like in the single-crystal that is pulled. What is being done more recently includes performing rapid cooling through the temperature region of defect formation, thereby diminishing the size of crystal defect, and making the wafer surface layer a defectless layer in subsequent heat treatment. By performing rapid cooling, the efficiency of producing single-crystal ingots can be enhanced.

As to performing the rapid cooling of single-crystals being pulled, there is a technology in which a cooler is disposed in the CZ furnace (WO93/00462 publication (Japanese Patent No. 2,562,245)). As is indicated in that publication, for the coolers used to perform the rapid cooling, cooling pipelines through which cooling water flows are generally adopted in the interest of ease of use and general purpose characteristics of the construction.

However, when a cooling pipeline through which cooling water flows is used as a cooler, there is a problem in that enormous damage will be inflicted on the device if and when the cooling pipeline fails and cooling water leaks out. When such an accident as this occurs, not only is the single-crystal ingot pulling environment adversely affected, but sometimes such an accident will lead to a situation wherein the production process is stopped, and the stable supply of single-crystal ingots is impeded.

DISCLOSURE OF THE INVENTION

In view of such problems as noted above, an object of the present invention is to effect improvements, in a single-crystal ingot producing device equipped with a cooler comprising a pipeline system through which cooling water is made to flow, to reduce device malfunctions caused by water leakage, and, simultaneously, to implement conditions for achieving maximum production efficiency.

As a result of assiduous research conducted by the inventors with a view to the problems noted in the foregoing, it was discovered that the cooler used to control crystal defects in single-crystal ingots being pulled need not be disposed in an extensive region inside the furnace, but need only be disposed in a limited narrow region. At the same time, it was confirmed that, by appropriately setting the cooling water flow volume and flow speed and the pipe diameter, etc., even when a cooler is disposed in such a limited narrow region, such a cooler functions adequately well as a cooler for raising the single-crystal ingot pulling speed and enhancing production efficiency, which leads to the completion of the present invention.

More specifically, the present invention provides the following device and method.

[Czochralski method silicon single-crystal ingot producing device]

First, the present invention provides Czochralski method silicon single-crystal ingot producing devices such as described below.

(1) A Czochralski method (hereinafter "CZ method") single-crystal ingot producing device for pulling, inside a furnace, single-crystal ingots from a raw material melt in a crucible, comprising a thermal shielding element that encloses a single-crystal ingot being pulled (hereinafter "being-pulled single-crystal ingot") and blocks radiant heat from liquid surface of the melt; and a cooler, disposed on inside of the thermal shielding element, for cooling a prescribed portion of the being-pulled single-crystal ingot, the thermal shielding element and the cooler being provided inside the furnace, wherein the cooler comprises a cooling pipeline through which cooling water flows, and is disposed in a portion of inside of the thermal shielding element.

(2) The CZ method single-crystal ingot producing device as described above, wherein the cooler is a cooling pipeline through which cooling water flows, and encloses the being-pulled single-crystal ingot; and inner diameter of the cooler is larger than inner diameter of the thermal shielding element.

(3) The CZ method single-crystal ingot producing device as described above, wherein lower end of the cooling pipeline is positioned at a position 150 mm or less from liquid surface of the melt.

(4) The CZ method single-crystal ingot producing device as described above, further comprising at least one of detection means noted below, either singly or in combination:
① a temperature sensor provided inside a gas exhaust pathway of a CZ furnace;
② tracking means for tracking intake volume of a pump for exhausting gas inside the CZ furnace; and
③ an infrared absorbance measuring sensor provided inside the CZ furnace or inside the exhaust path of the CZ furnace.

(5) The CZ method single-crystal ingot producing device as described above, further comprising magnetic field application means for applying a magnetic field into a raw material melt inside the crucible.

(6) The CZ method single-crystal ingot producing device as described above, wherein the magnetic field application means are magnetic field application means for generating an isometrically symmetrical and radially formed cusp magnetic field inside the raw material melt.

[Pipeline Setting Method for CZ Method Single-crystal Ingot Producing Device]

(7) A method for setting a pipeline for a CZ method single-crystal ingot producing device for causing a cooling fluid to flow through a pipeline in a CZ furnace so as to rapidly cool a single-crystal ingot being pulled, wherein position of a lower end of the pipeline through which the cooling fluid flows is set low and inner diameter of the pipeline is made small, and flow speed of the cooling fluid is controlled in accordance with diameter of the being-pulled single-crystal ingot, whereby temperature gradient of the being-pulled single-crystal ingot in pulling direction is increased, device stability is enhanced, and flexibility for arranging the pipeline is enhanced.

(8) The method as describe above, wherein the pipeline used for the rapid cooling is disposed in a portion on the inside of the heat shield in the furnace.

Here, when the inner diameter of the cooling pipeline is small, even if it should happen that a water leak occurs, the volume of leaking water will be small compared to the case of a large inner diameter. Furthermore, it was confirmed by the inventors that, in that portion that is 150 mm or less (and particularly the portion that is 100 mm or less) from the liquid surface of the silicon melt, if the inner diameter of the cooling pipeline is made smaller, there is no great change in the cooling effect contributing to the temperature gradient in the pulling direction. Accordingly, making the inner diameter of the cooling pipeline smaller in that portion means that device malfunctions caused by water leakage can be reduced while maintaining the cooling effect for contributing to the control of the temperature gradient in the pulling direction. This also, at the same time, leads to the realization of improvements in production efficiency by upping the pulling speed.

According to the present invention, the flexibility the pipeline can be enhanced. This is because, if the pipeline is narrow, the accommodation volume capacity of the pipeline may be made smaller, and bending and other processing are made easier. What is significant in the present invention, however, is that the flexibility in the arrangement of the pipeline can be enhanced without diminishing the cooling effect, and in a condition of enhanced safety. That significance is particularly great when the pipeline is disposed in a portion on the inside of the thermal shielding element.

[Temperature Gradient Controlling Method for Being-pulled Single-crystal Ingot]

The cooler according to the present invention cools prescribed locations in a focused manner in order to make the temperature gradient in the direction the single-crystal ingot is being pulled larger. Therefore, the present invention also includes a method such as the following as another aspect thereof.

(9) A method for controlling temperature gradient in a pulling direction of a single-crystal ingot being pulled, the method being applied to a CZ method single-crystal ingot producing device that comprises, inside a furnace, a thermal shielding element that encloses the single-crystal ingot being pulled inside the furnace and blocks radiant heat from liquid surface of a melt; and a cooler, disposed on the inside of the thermal shielding element, that cools a prescribed portion of the being-pulled single-crystal ingot, wherein the cooler is disposed in a portion inside the thermal shielding element, whereby temperature gradient of the being-pulled single-crystal ingot in the direction of pulling is controlled.

[Other Aspects of CZ Method Single-crystal Ingot Producing Device]

The present invention further provides such CZ method single-crystal ingot producing methods as those described below.

(10) The CZ method single-crystal ingot producing device as described in any one of (1) to (6) above, wherein treatment for enhancing heat absorbing properties is carried out on surface of the cooler facing the being-pulled single-crystal ingot.

(11) The CZ method single-crystal ingot producing device as described in (10) above, wherein the treatment for enhancing heat absorbing properties includes black coloring.

(12) The CZ method single-crystal ingot producing device as described in (11) above, wherein the treatment of black coloring is performed by PVD method.

As a preferable PVD method, there is the ion plating, and as a preferable substance for configuring a film, there is titanium aluminum nitride.

If a cooler is employed that has been subjected to a surface process to enhance the heat absorbing properties, the cooling effect produced by the present invention can be enhanced even further. And, by enhancing the cooling effect, it becomes possible to make the cooler smaller.

[Another Aspect of the Temperature Gradient Controlling Method for Being-pulled Single-crystal Ingot]

The present invention, furthermore, includes a method such as the following wherein a cooler is used that has been subjected to a surface process to enhance the heat absorbing properties.

(13) The method as described in (9) above, wherein a cooler whose surface facing the being-pulled single-crystal ingot is treated so as to enhance heat absorbing properties thereof, is employed as the cooler, whereby temperature. gradient of the being-pulled single-crystal ingot in direction of pulling is controlled while enhancing heat absorbing effect generated by the cooler.

[Definition of Terms, etc.]

In this device, it is noted that "the lower end of the cooling pipeline . . . is positioned at a position 150 mm or less from the liquid surface of the melt." The upper limit of the lower end of the cooling pipeline is a position that is 150 mm from the liquid surface of the melt, but the lower limit of the lower end of the cooling pipeline is a distance wherewith the liquid surface of the silicon melt is not contacted, and should be a distance wherewith no anomalies or the like occur in the cooler due to the radiant heat from the liquid surface of the melt.

The "tracking means" that track the intake volume of the pump that exhausts the gas from inside the CZ furnace may be either means such as a flow volume sensor that tracks the pump intake volume and detects changes therein that are provided separately, or means such that the pump itself in some form or other comprises such a detection mechanism. That is, in the case where the pump is, itself, subjected to inverter control, for example, changes in the intake volume appear as changes in electric power consumption, but, for the "tracking means" noted earlier, cases are also included where the pump itself ascertains those power consumption changes.

With respect to the terminology "either singly or in combination," by "singly" is meant the adoption of any one of items ①, ② and ③ above, while "in combination" means a combination of two or more different items, such as ① and ②, or ① and ③, or ①, ② and ③. By "at least one, respectively," is meant that combinations of two or more of the same type are allowed, such as the combination of ① and ① in the single case of ①, or ① and ① and ② in the case of a combination of ① and ②. In other words, the adoption of such a form as two temperature sensors and one flow volume sensor is also included in the concept of this device.

By "temperature sensor" is meant something like a thermocouple, for example. By "flow volume sensor," moreover, is meant something that, in some fashion or other, measures the flow volume of a gas, which includes both things that measure the volume of gas passage and things that directly measure the speed of gas passage. The "infrared absorbance measuring sensor" may be either something that measures the volume of infrared radiation absorbed or something that measures the absorption rate. Nor does it matter whether the "infrared absorbance measuring sensor" is a reflecting type or a transmitting type.

For the "magnetic field application means for applying a magnetic field inside the raw material melt inside the crucible", something like that disclosed in Japanese Patent Application Laid-Open No. 56-45889, for example, can be used. And for the "magnetic field application means for producing . . . a cusp magnetic field," something like that disclosed in Japanese Patent Application Laid-Open No. 58-217493 can be used.

The "cooling fluid" typically is water. However, there is no limitation on the type in this method so long as it is a fluid that conveys heat efficiently, and a gas or liquid other than water can also be used.

Examples of a "process with which the heat absorbing properties are enhanced" include not only processes that include a "black film formation. process (i.e. coloring process)" like that described subsequently in an embodiment, but, even in a coloring process, the color need not be black if it is a color that will cause the infrared radiation reflectivity to be reduced (a process for coloring brown or dark red or the like, for example). Also included, in addition to coloring processes other than black coloring, are processes that change the shape or surface of the cooler and thus cause the thermal reflectivity to be reduced, for example (such as a process or the like that forms irregularities on the surface, for example).

With respect to the terminology "process that includes a black coloring process," the term "includes" means that a process other than a "black coloring process" may be included in the "process wherewith the heat absorbing properties are enhanced." Accordingly, for example, together with the "black coloring process" noted earlier, processing that includes a coloring process other than that black color process, and processes that change the shape or surface of the cooler and thus cause the thermal reflectivity to be reduced, for example (such as a process that forms irregularities on the surface) may also be used.

In addition to the sputtering and ion plating adopted in embodiments described subsequently, the "PVD methods" also include vapor deposition. Nevertheless, it is preferable that ion plating be used due to the tight bonding. properties of the films formed. The use of sputtering is also preferable in cases where variety in the elements configuring the film is taken into consideration.

In the method and device according to the present invention, there are no factors that are influenced by the type of the single-crystal ingot that is pulled, and the method is considered to be a method that can be applied to CZ methods in general. Therefore, single-crystal ingots being pulled are not limited to silicon single-crystal ingots.

BEST MODE FOR CARRYING OUT THE INVENTION

Figure 1:
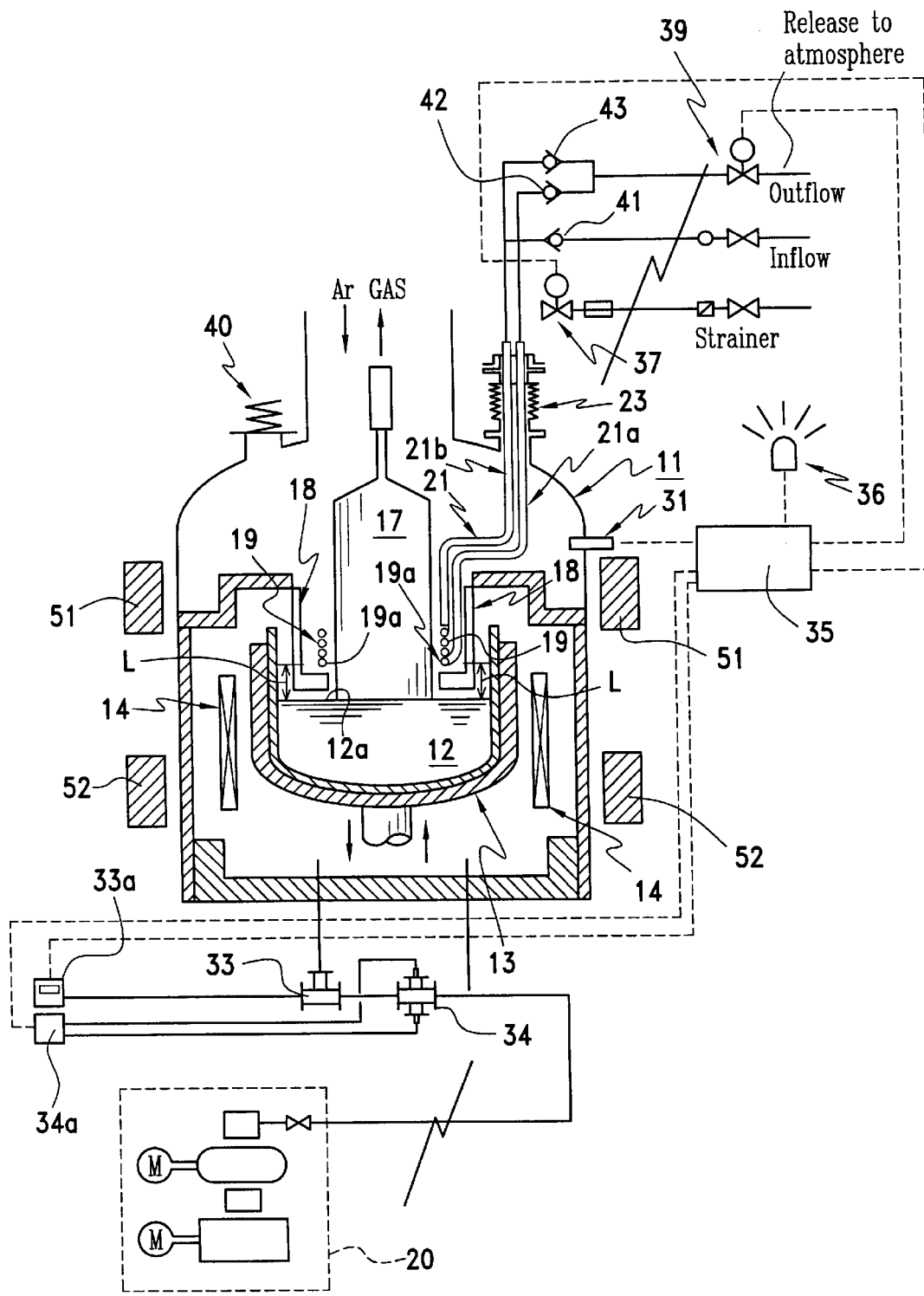
FIG. 1 is a block diagram illustrating a preferred embodiment of a silicon single-crystal ingot producing device according to the present invention.

FIG. 1 is a block diagram illustrating a preferred embodiment of a silicon single-crystal ingot producing device according to the present invention.
[Overall Configuration]

The silicon single-crystal ingot producing device according to the present invention, in like manner as an ordinary CZ method silicon single-crystal ingot producing device, comprises, inside a chamber 11 that is a tightly sealed vessel, a crucible 13 for fabricating and storing a silicon melt 12, and a heater 14 for heating the crucible 13. In addition to that, in like manner as in an ordinary CZ method silicon single-crystal ingot producing device, as appropriate, electrodes for supplying electric power to the heater 14, a crucible holder for supporting the crucible 13, a pedestal for turning the crucible 13, thermal insulation, a melt receiver, and inner tube and the like are provided. In this device, furthermore, are provided a thermal shielding element 18 for shielding the silicon ingot 17 from heat radiated from the silicon melt 12 and heater 14, and a cooler 19 disposed on the inside of that thermal shielding element 18.

The silicon single-crystal ingot producing device according to the present invention further comprises an inert gas introduction and exhaust system such as is ordinarily provided in this type of CZ method silicon single-crystal ingot producing device. In a system such as this, the thermal shielding element 18 also functions to control the inert gas flow path. In this device, furthermore, a vacuum pump 20 for exhausting the gas inside the chamber 11 is connected (and, by providing the vacuum pump 20 with means for detecting the aperture of a throttle valve or detecting the amount of electric power supplied, it becomes unnecessary to separately provide the pressure sensor described subsequently).

Furthermore, the silicon single-crystal ingot producing device according to the present invention is provided with solenoids 51 and 52 for imparting a cusp magnetic field to the silicon melt 12. By the cusp magnetic field being applied to the silicon melt 12 by these solenoids 51 and 52, the minute convection that occurs in the silicon melt 12 can be eliminated, making it possible to further promote reductions in crystal defects, and stable pulling and the like.
[Cooler]

What is characteristic in the silicon single-crystal ingot producing device according to the present invention are the fact that the cooler 19, which is configured by a pipeline through which cooling water flows, is disposed in a portion inside the thermal shielding element 18, and the fact that the distance L to the lower end 19a from the silicon melt liquid surface 12a is set at 150 mm or less. As already described, by setting the lower end 19a of the cooler 19 within this range, the size of crystal defects can be made very minute through the increase in the temperature gradient in that portion, and, simultaneously, the speed of pulling the silicon single-crystal ingots can be raised, so that an enhancement in production efficiency can be realized. Also, it is sufficient if the height of the cooler 19 according to the present invention (i.e. the length from the lower end to the upper end of the pipeline) is 100 mm.

Cooling water flows inside the cooler 19 configured by the pipeline, and that cooling water is supplied via a supply tube 21a. At the place where a supply and exhaust pipe 21 inclusive of the supply tube 21a (comprising the set of the supply tube 21a and an exhaust tube 21b) penetrates inside the chamber 11, a bellows member 23 is provided to preserve airtightness. While the cooler 19 itself does not move, the crucible 13 is moved up and down by a lifter (not shown) disposed below the crucible 13. In this device, the crucible 13 rises as the liquid surface 12a of the silicon melt descends in conjunction with the pulling of the silicon single-crystal ingot, and the distance L to the lower end 19a of the cooler 19 is adjusted so as always to remain equal to or less than 150 mm.

In this embodiment, the inner diameter of the pipeline configuring the cooler 19 is 17 mm or smaller, and the flow speed of the cooling water flowing through the pipeline is set at 15 liters/minute or lower. The inner diameter of the pipeline, compared to similar conventional art, has been made small, on the order of half in terms of cross-sectional area. Even when that is so small, if the distance L is 150 mm or less, there is no great difference in cooling effect from the perspective of the contribution made to the temperature gradient in the pulling direction relative to the defect formation temperature region, as noted earlier. Nevertheless, by making the inner diameter of the pipeline small, the volume of water standing in the cooler 19 becomes less, wherefore, even in the event that the cooling pipeline should fail and water leakage occur, the volume of water leaked will be small, corresponding to the small volume of water standing in the cooler 19. Therefore, when compared to the same type of conventional device, the damage that ensues when a water leak has occurred can be kept small. In other words, in this device, damage resulting from a water leak can be reduced while production efficiency is enhanced.

In the cooler 19 according to the present invention, furthermore, in order to raise the emissivity and increase the amount of heat absorbed, a black film is formed on the surface on the silicon ingot 17 side (i.e. on the surface that faces the silicon ingot 17), which black film is formed by a PVD method (process of coating uniformly at low temperature (200 to 400° C.)).

The properties of the black film (coloring film) formed by the PVD method are given in Table 1 below. In this table, by "infrared absorbance 75% or so" is indicated that the infrared absorbance has been improved over what it would be with no black film formed.

TABLE 1

| Category | Coloring film | Hardness | Infrared absorbance | Heat resistance | Processing furnace |
|---|---|---|---|---|---|
| Sputtering | TiAl | 2000 Hvkg/mm$^2$ | — | — | Small |
| Ion plating | TiAlN | 2300–2500 Hvkg/mm$^2$ | 75% or so | 600° C. | Sufficiently large |

Because the black film is formed on the surface on the silicon ingot 17 side of the cooler 19 so that the emissivity of that surface on the silicon ingot 17 side is enhanced, the amount of heat absorbed becomes large and the cooling effect can be further enhanced. For that reason, by subjecting the surface on the silicon ingot 17 side of the cooler 19 to a black PVD process, the pulling speed for the silicon ingot 17 can be raised.

Further, by forming the film by the PVD method, advantages such as those noted below can be realized.
(1) Because the film formed by the PVD method is resistant to temperatures up to 600° C. or so, even in cases where the cooling water to the cooler 19 has been interrupted due to some kind of trouble, the possibility that the film properties will be changed can be sharply reduced. With the Inco method that has to date been used as a process for forming black films, for example, the film (Inco film) can withstand temperatures up to 200° C., wherefore there is a danger that the properties of the film will be changed when the cooling water is stopped.
(2) Films formed by the PVD method excel in strength and heat resistance, wherefore they are resistant to damage such as scratching during processing, installation and use. Further, the danger of the film peeling away is reduced. Accordingly, even should something hard come up against the black film in the production process or during installation, that black film can be prevented from peeling (whereas with an Inco film, film strength and the strength of bonding to the SUS mother material is weak, wherefore even the black film has sometimes peeled away).

Because the danger of the black film peeling away is slight, an advantage is gained in that the black film is not likely to become a source of pollution.

Furthermore, when removing the amorphous SiO$_x$ adhering to the surface of the cooler 19, peeling also the black film can be protected against (whereas with the Inco method there was a danger of peeling also the black film). Removing the amorphous SiO$_x$ also becomes easy.

Thus, in the present invention, because a black film that does not readily peel is formed, not only can the reliability of the device when used repeatedly be increased, but the damage imparted to the whole by the peeling away of the black film that becomes a problem when the cooler is made small in size can be reduced.

[Safety Measures]

In the silicon single-crystal ingot producing device according to this embodiment, a pressure sensor 31 for tracking changes in the pressure inside the chamber 11, a temperature sensor 33 for monitoring changes in the temperature of the gas inside the chamber 11 sucked in by the vacuum pump 20, and an infrared sensor 34 for monitoring the infrared absorption of the gas inside the chamber 11 sucked in by the vacuum pump 20 are provided. This is done so that water leaks might be accurately sensed by detecting the temperature changes or pressure changes that are caused by leaked water being turned to steam by the heat inside the furnace when a water leak occurs in the pipeline of the cooler 19. In view of the fact that steam absorbs infrared radiation, the infrared sensor 34 detects that, and is thus installed in order to increase the probability of detecting any water leak that occurs.

Although it is altogether possible to sense a water leak if any one of these sensors is installed, in the interest of insuring detection without fail, a plurality of these sensors may be installed in combination. From the same perspective, moreover, there is no obstacle to installing a plurality of the same type of sensor.

Because the temperature sensor 33 will not respond in a way that can be distinguished from changes in other conditions unless steam is present in a comparatively large quantity, it should be provided at a location where the steam will be concentrated, in order to surely detect temperature changes caused by steam. Fundamentally, therefore, the temperature sensor 33 should be provided in the exhaust path (that is, in a pipe connected to the vacuum pump 20). The infrared sensor 34, on the other hand, is capable of immediately detecting small quantities of steam, and hence can be provided anywhere, such as on an inner wall in the chamber 11, and not just in the exhaust path.

The sensors described above are connected to a controller 35. In this embodiment, the pressure sensor 31 is provided directly to the controller 35, while the temperature sensor 33 and the infrared sensor 34 are provided to the controller 35 through corresponding processors 33a and 34a, respectively.

For example, in a case where a rise in pressure inside the chamber 11 induced by steam generation is detected by the pressure sensor 31, a case where a high temperature change in the exhaust gas induced by steam generation is detected by the temperature sensor 33, a case where anomalous absorption is recognized in the steam absorption band by the infrared sensor 34, or a case where these events have occurred simultaneously, the controller 35 goes into action to cause a display instrument 36 to flash, to close a solenoid valve 37 that controls the inflow of cooling water to stop the inflow of cooling water, and, simultaneously therewith, to open a solenoid valve 39, that ordinarily is closed, so as to open the terminal end of the exhaust tube 21b to the atmosphere. When that is done, in cases where steam has been generated, the leaked water will become steam and increase the pressure. In such a case, the cooling water inside the cooler 19 will pass through the solenoid valve 39 and be discharged to the outside, whereupon the volume of water falling into the silicon melt can be decreased.

This tube that opens to the atmosphere is connected to the supply tube 21a, and that which was to be supplied from that point on inside the cooler 19 can be discharged also. For that reason, when a water leak occurs, as much of the cooling water standing inside the cooler 19 as possible can be discharged. Therefore, the damage to the device will be slight, and, even in such cases as that, it will become possible to avoid situations such as terminating the operations of the device. Nevertheless, in the silicon single-crystal ingot producing device according to this embodiment, in order to be fully prepared for an emergency situation, as a safety measure, a safety valve 40 is installed in the chamber 11. Also, the check valves 41, 42, and 43 are installed in the cooling water outflow pipes and pipes open to the atmosphere, so that full precautions are taken regarding emergency situations.

Industrial Applicability

As described in the foregoing, in the single-crystal ingot producing device according to the present invention, by performing cooling accurately near the liquid surface of the single-crystal ingot melt, making the temperature gradient in the pulling direction larger is contributed to, making the size of crystal defects very minute and improving production efficiency can be realized, cooling can be effected with a small volume of cooling water, and improving the efficiency wherewith single-crystal ingots are produced can be realized simultaneously with reducing damage caused by water leakage accidents.

Furthermore, processing is done so as to enhance the heat absorbance of the surface of the cooler on the silicon ingot side, wherefore the cooling effect can be further enhanced. When the cooler is made small, an even greater contribution is made to the effectiveness of the present invention in reducing damage when a water leak occurs.

What is claimed is:

1. A Czochralski method (hereinafter "CZ method") single-crystal ingot producing device for pulling, inside a furnace, single-crystal ingots from a raw material melt in a crucible, comprising:

a thermal shielding element that encloses a single-crystal ingot being pulled (hereinafter "being-pulled single-crystal ingot") and blocks radiant heat from liquid surface of the melt; and a cooler, disposed on inside of the thermal shielding element, for cooling a prescribed portion of the being-pulled single-crystal ingot, the thermal shielding element and the cooler being provided inside the furnace, wherein the cooler comprises a cooling pipeline having an inner diameter of 17 mm or smaller through which cooling water flows, and is disposed in a portion of inside of the thermal shielding element.

2. The CZ method single-crystal ingot producing device according to claim 1, wherein lower end of the cooling pipeline is positioned at a position 150 mm or less from liquid surface of the melt.

3. The CZ method single-crystal ingot producing device according to claim 2, further comprising at least one of detection means noted below, either singly or in combination:

a temperature sensor provided inside a gas exhaust pathway of a CZ furnace:

Tracking means for tracking intake volume of a pump for exhausting gas inside the CZ furnace; and an infrared absorbance measuring sensor provided inside the CZ furnace or inside the exhaust path of the CZ furnace.

4. The CZ method single-crystal ingot producing device according to claim 2, further comprising magnetic field application means for applying a magnetic field into a raw material melt inside the crucible.

5. The CZ method single-crystal ingot producing device according to claim 1, further comprising at least one of detection means noted below, either singly or in combination:

a temperature sensor provided inside a gas exhaust pathway of a CZ furnace:

tracking means for tracking intake volume of a pump for exhausting gas inside the CZ furnace; and an infared absorbance measuring sensor provided inside the CZ furnace or inside the exhaust path of the CZ furnace.

6. The CZ method single-crystal ingot producing device according to claim 5, further comprising magnetic field application means for applying a magnetic field into a raw material melt inside the crucible.

7. The CZ method single-crystal ingot producing device according to claim 1, further comprising magnetic field application means for applying a magnetic field into a raw material melt inside the crucible.

8. The CZ method single-crystal ingot producing device according to claim 7, wherein the magnetic field application means are magnetic field application means for generating an isometrically symmetrical and radially formed cusp magnetic field inside the raw material melt.

9. The CZ method single-crystal ingot producing device according to claim 1, wherein treatment for enhancing heat absorbing properties is carried out on surface of the cooler facing the being-pulled single-crystal ingot.

10. The CZ method single-crystal ingot producing device according to claim 9, wherein the treatment for enhancing heat absorbing properties includes black coloring.

11. The CZ method single-crystal ingot producing device according to claim 10, wherein the treatment of black coloring is performed by PVD method.

12. A method for setting a pipeline for a CZ method single-crystal ingot producing device for causing a cooling fluid to flow through a pipeline in a CZ furnace so as to rapidly cool a single-crystal ingot being pulled, wherein position of a lower end of the pipeline through which the cooling fluid flows is set to be equal to or less than 150 mm from liquid surface of a melt and inner diameter of the pipeline is 17 mm or smaller, and flow speed of the cooling fluid controlled in accordance with diameter of the being-pulled single-crystal ingot, whereby temperature gradient of the being-pulled single-crystal ingot in pulling direction is increased, device stability is enhanced, and flexibility for arranging the pipeline is enhanced.

13. The method according to claim 12, wherein the pipeline used for the rapid cooling is disposed in a portion on the inside of the heat shield in the furnace.

14. A method for controlling temperature gradient in a pulling direction of a single-crystal ingot being pulled, the method being applied to a CZ method single-crystal ingot producing device that comprises, inside a furnace:

a thermal shield element that encloses the single-crystal ingot being pulled inside the furnace and blocks radiant heat from liquid surface of a melt; and a cooler, disposed on the inside of the thermal shielding element, that cools a prescribed portion of the being-pulled single-crystal ingot, wherein the cooler comprises a ring-shaped cooling pipeline having an inner diameter of 17 mm or smaller, and is disposed in a portion inside the thermal shielding element, whereby temperature gradient of the being-pulled single-crystal ingot in the direction of pulling is controlled.

15. The method according to claim 14, wherein a cooler whose surface facing the being-pulled single-crystal ingot is treated so as to enhance heat absorbing properties thereof, is employed as the cooler, whereby temperature gradient of the being-pulled single-crystal ingot in direction of pulling is controlled while enhancing heat absorbing effect generated by the cooler.

16. A Czochralski method (hereinafter "CZ method") single crystal ingot producing device for pulling, inside a furnace, single-crystal ingots from a raw material melt in a crucible, comprising:

a thermal shielding element that encloses a single-crystal ingot being pulled (hereinafter "being-pulled single-crystal ingot") and blocks radiant heat from liquid surface of the melt; and a cooler, disposed on inside of the thermal shielding element, for cooling a prescribed portion of the being-pulled single-crystal ingot, the thermal shielding element and the cooler being provided inside the furnace, wherein the cooler comprises a cooling pipeline through which cooling water flows, and is disposed in a portion of inside of the thermal shielding element, the CZ method single-crystal ingot producing device further comprising at least one detection means notable, either singly or in combination:

a temperature sensor provided inside a gas exhaust pathway of a CZ furnace;

tracking means for tracking intake volume of a pump for exhausting gas inside the CZ furnace; and an infrared absorbance measuring sensor provided inside the CZ furnace or inside the exhaust path of the CZ furnace.

17. The CZ method single-crystal ingot producing device according to claim 16, wherein the cooler is a cooling pipeline through which cooling water flows, and encloses the being-pulled single-crystal ingot; and inner diameter of the cooler is larger than inner diameter of the thermal shielding element.

18. The CZ method single-crystal ingot producing device according to claim 16, wherein lower end of the cooling pipeline is positioned at a position 150 mm or less from liquid surface of the melt.

19. A Czochralski method (hereinafter "CZ method") single crystal ingot producing device for pulling, inside a furnace, single-crystal ingots from a raw material melt in a crucible, comprising:

a thermal shielding element that encloses a single-crystal ingot being pulled (hereinafter "being-pulled single-crystal ingot") and blocks radiant heat from liquid surface of the melt;

a cooler, disposed on inside of the thermal shielding element, for cooling a prescribed portion of the being-pulled single-crystal ingot, the thermal shielding element and the cooler being provided inside the furnace, wherein the cooler comprises a cooling pipeline through which cooling water flows, and is disposed in a portion of inside of the thermal shielding element; and magnetic field application means for applying a magnetic field into a raw material melt inside the crucible.

20. The CZ method single-crystal ingot producing device according to claim 19, wherein the cooler is a cooling pipeline through which cooling water flows, and encloses the being-pulled single-crystal ingot; and inner diameter of the cooler is larger than inner diameter of the thermal shielding element.

21. The CZ method single-crystal ingot producing device according to claim 19, wherein lower end of the cooling pipeline is positioned at a position 150 mm or less from liquid surface of the melt.

22. The CZ method single-crystal ingot producing device according to claim 19, wherein the magnetic field application means are magnetic field application means for generating an isometrically symmetrical and radially formed cusp magnetic field inside the raw material melt.

* * * * *